(12) United States Patent
Markle

(10) Patent No.: US 7,337,091 B1
(45) Date of Patent: Feb. 26, 2008

(54) METHOD AND APPARATUS FOR COORDINATING FAULT DETECTION SETTINGS AND PROCESS CONTROL CHANGES

(75) Inventor: Richard J. Markle, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 393 days.

(21) Appl. No.: 10/284,841

(22) Filed: Oct. 31, 2002

(51) Int. Cl.
G06F 11/30 (2006.01)
H01L 21/00 (2006.01)

(52) U.S. Cl. .............. 702/185; 702/183; 700/173; 700/175; 438/5; 438/14

(58) Field of Classification Search .......... 716/4; 438/5, 14; 702/183, 185; 700/121, 173, 700/175, 177
See application file for complete search history.

(56) References Cited

U.S. PATENT DOCUMENTS

| | | | |
|---|---|---|---|
| 5,808,432 A * | 9/1998 | Inoue et al. | 318/561 |
| 5,949,685 A * | 9/1999 | Greenwood et al. | 700/193 |
| 6,154,711 A * | 11/2000 | Steffan et al. | 702/82 |
| 6,560,504 B1 * | 5/2003 | Goodwin et al. | 700/121 |
| 6,587,744 B1 * | 7/2003 | Stoddard et al. | 700/121 |
| 6,594,589 B1 * | 7/2003 | Coss, Jr. et al. | 702/34 |
| 6,597,447 B1 * | 7/2003 | Stirton et al. | 356/237.2 |
| 6,678,569 B2 * | 1/2004 | Bunkofske et al. | 700/108 |
| 6,708,075 B2 * | 3/2004 | Sonderman et al. | 700/121 |
| 6,810,360 B2 * | 10/2004 | Fujishima et al. | 702/182 |
| 6,909,993 B2 * | 6/2005 | Nakao et al. | 702/185 |
| 6,913,938 B2 * | 7/2005 | Shanmugasundram et al. | 438/16 |
| 6,922,595 B1 * | 7/2005 | Peterson et al. | 700/40 |
| 6,950,716 B2 * | 9/2005 | Ward et al. | 700/121 |
| 6,954,883 B1 * | 10/2005 | Coss et al. | 714/47 |
| 7,275,245 B2 * | 9/2007 | Huber | 717/170 |
| 2003/0125828 A1 * | 7/2003 | Corey | 700/186 |

* cited by examiner

Primary Examiner—John Barlow
Assistant Examiner—Janet L Suglo
(74) Attorney, Agent, or Firm—Williams, Morgan & Amerson, P.C.

(57) ABSTRACT

A system includes a process tool for processing a workpiece, a process controller, and a fault monitor. The process controller is configured to determine a control action for updating an operating recipe of the process tool. The fault monitor is configured to determine at least one fault detection threshold based on the control action. A method includes determining a control action for updating an operating recipe of a process tool and determining at least one fault detection threshold based on the control action.

13 Claims, 3 Drawing Sheets

METHOD AND APPARATUS FOR COORDINATING FAULT DETECTION SETTINGS AND PROCESS CONTROL CHANGES

BACKGROUND OF THE INVENTION

1. Field of the Invention

This invention relates generally to the field of semiconductor device manufacturing and, more particularly, to a method and apparatus for coordinating fault detection settings and process control changes.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a lot of wafers using a variety of processing tools, including photolithography steppers, etch tools, deposition tools, polishing tools, rapid thermal processing tools, implantation tools, etc. The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of a semiconductor processing line includes using a factory wide control system to automatically control the operation of the various processing tools. The manufacturing tools communicate with a manufacturing framework or a network of processing modules. Each manufacturing tool is generally connected to an equipment interface. The equipment interface is connected to a machine interface that facilitates communications between the manufacturing tool and the manufacturing framework. The machine interface can generally be part of an advanced process control (APC) system. The APC system initiates a control script based upon a manufacturing model, which can be a software program that automatically retrieves the data needed to execute a manufacturing process. The control script generates control actions for making process control adjustments to the process to reduce variation in the processed devices with respect to a desired target value.

Data gathered during the course of wafer processing is used to identify and attempt to mitigate the effects of process and equipment variations by implementing automatic control techniques (i.e., process control) and/or automatic fault detection and classification (FDC) techniques based on the collected data.

Fault detection analysis may be conducted on metrology data collected for the processed wafers to determine if the device characteristics are within acceptable ranges. For example, if the dimensions of a particular feature are outside an acceptable range, the wafer may be either reworked or scrapped. Fault detection is also performed on data collected during the processing runs of the tools used to process the wafers. The data may be supplied by the tools, sensors associated with the tools, and/or process controllers controlling the tools.

The health of a tool may be determined by employing a multivariate tool health model adapted to predict the expected operating parameters of the tool during the processing run. If the actual observed tool parameters are close to the predicted tool parameters, the tool is said to have a high health metric (i.e., the tool is operating as expected). As the gap between the expected tool parameters and the observed tool parameters widens, the tool health metric decreases. An exemplary tool health monitor software application is ModelWare™ offered by Triant, Inc. of Nanaimo, British Columbia, Canada Vancouver, Canada. An exemplary system for monitoring tool health is described in U.S. patent application Ser. No. 09/863,822, entitled "METHOD AND APPARATUS FOR MONITORING TOOL HEALTH," filed in the names of Elfido Coss Jr., Richard J. Markle, and Patrick M. Cowan, that is assigned to the assignee of the present application and incorporated herein by reference in its entirety.

In some cases, where a high degree of oversight is desired for a particular tool or product (e.g., for processing a high grade device), the thresholds for determining fault conditions are set to indicate a fault condition for even slight deviations from expected values. In response to a fault condition, a particular tool may be automatically shut down to avoid producing subsequent faulty wafers.

Process control actions typically result in shifting one or more operating parameters of a tool to reduce variation on the wafers processed by the tool. These intentional shifts also cause shifts in the data collected for analyzing the tool health. The tools health monitoring applications do not expect such a shift and may erroneously indicate a fault condition with the tool upon observing the shift. Accordingly, the tool may be automatically shut down by the FDC system and production time may be lost. Operator or engineering intervention is typically required to determine that no fault condition actually exists and to reset the tool health model and associated FDC limits. Unnecessary tool shutdowns consume valuable processing and engineering time and may reduce the profitability of the fabrication facility.

The present invention is directed to overcoming, or at least reducing the effects of, one or more of the problems set forth above.

SUMMARY OF THE INVENTION

One aspect of the present invention is seen in a system including a process tool for processing a workpiece, a process controller, and a fault monitor. The process controller is configured to determine a control action for updating an operating recipe of the process tool. The fault monitor is configured to determine at least one fault detection threshold based on the control action.

Another aspect of the present invention is seen in a method including determining a control action for updating an operating recipe of a process tool and determining at least one fault detection threshold based on the control action.

BRIEF DESCRIPTION OF THE DRAWINGS

The invention may be understood by reference to the following description taken in conjunction with the accompanying drawings, in which like reference numerals identify like elements, and in which.

Figure 1:
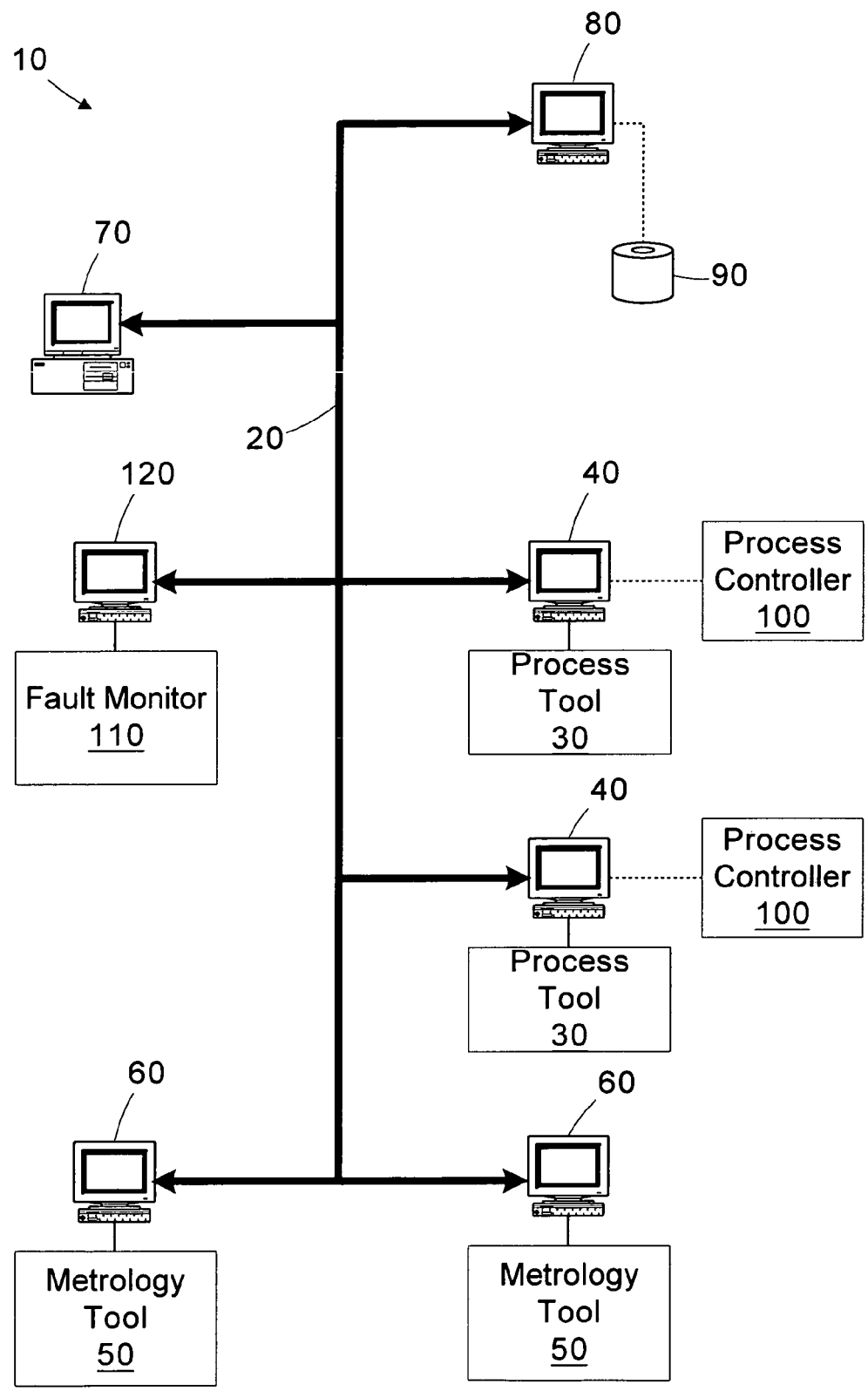
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of an illustrative manufacturing system 10 is provided. In the illustrated embodiment, the manufacturing system is adapted to process semiconductor wafers, however, the invention is not so limited and may be applied to other types of manufacturing environments and other types of workpieces. A network 20 interconnects various components of the manufacturing system, allowing them to exchange information. The illustrative manufacturing system 10 includes a plurality of process tools 30, each being coupled to a computer 40 for interfacing with the network 20. The manufacturing system 10 also includes one or more metrology tools 50, each coupled to a computer 60 for interfacing with the network 20. The metrology tools 50 may be used to measure output characteristics of the wafers processed in the process tool 30 to generate metrology data. Although the tools 30, 50 are illustrated as interfacing with the network 20 through the computers 40, 60, the tools 30, 50 may include integrated circuitry for interfacing with the network 20, eliminating the need for the computers 40, 60. A manufacturing execution system (MES) server 70 directs the high level operation of the manufacturing system 10 by directing the process flow of the manufacturing system 10. The MES server 70 monitors the status of the various entities in the manufacturing system, including the tools 30, 50. The process tools 30 may be any one of a variety of tools for processing wafers, such as photolithography steppers, etch tools, deposition tools, polishing tools, rapid thermal process tools, implantation tools, etc.

A database server 80 is provided for storing data related to the status of the various entities and workpieces (e.g., wafers) in the process flow. The database server 80 may store information in one or more data stores 90. The metrology data may include feature measurements, process layer thicknesses, electrical performance characteristics, defect measurements, surface profiles, etc. The data store 90 may also store data collected during the processing performed by one of the tools 30 (i.e., by the tool 30 itself or by sensors (not shown) associated with the tools 30). Maintenance history for the tools 30-80 (e.g., cleaning, consumable item replacement, repair) may also be stored in the data store 190 by the MES server 70 or by a tool operator. The distribution of the processing and data storage functions amongst the different computers 40, 60, 70, 80 is generally conducted to provide independence and a central information store. Of course, different numbers of computers and different arrangements may be used.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Some of the process tools 30 include process controllers 100 that are adapted to automatically control the operating recipes of their respective tools 30. A particular process tool 30 may have more than one process controller 100 adapted to control more than one operating recipe parameter based on feedback and/or feedforward metrology data collected. If the tool 30 is a CMP tool, the process controller 100 may receive pre-polish thickness measurements (e.g., thickness of high features, thickness of low features) and predict a polishing time or pressure required to achieve a post-polish target thickness. In the case where the process tool 30 is an etch tool, the process controller 100 may model the etching performance of the process tool 30 based on pre-etch and/or post-etch thickness measurements. The process controller 100 may use a control model of the process tool 30 to generate its prediction. The control model may be developed empirically using commonly known linear or non-linear techniques. The control model may be a relatively simple equation based model (e.g., linear, exponential, weighted average, etc.) or a more complex model, such as a neural network model, principal component analysis (PCA) model, or a projection to latent structures (PLS) model. The specific implementation of the control model may vary depending on the modeling technique selected. Using the control model, the process controller 100 may determine operating recipe parameters to reduce post-processing variations. The particular control scenario depends on the particular type of process tool 30 being controlled.

The manufacturing system also includes a fault monitor 110 executing on a workstation 120 for detecting fault conditions. The fault monitor 110 may employ various types of fault detection techniques to determine fault conditions, such as statistical process control (SPC) analysis, partial least squares/principal component analysis (PLS/PCA), multivariate tool health analysis, etc. In general, the fault monitor 110 employs one of more fault detection thresholds for identifying fault conditions. These thresholds may include control limits based on measured wafer characteristics or tool health limits based on overall tool health or individual monitored tool parameters. The fault detection thresholds may incorporate one or more observed or measured parameters. The process controller 100 is configured to interface with the fault monitor 110 to communicate process control actions implemented for its associated tool 30, so that the fault detection thresholds for the fault monitor 110 may be automatically adjusted as necessary.

Figure 2:
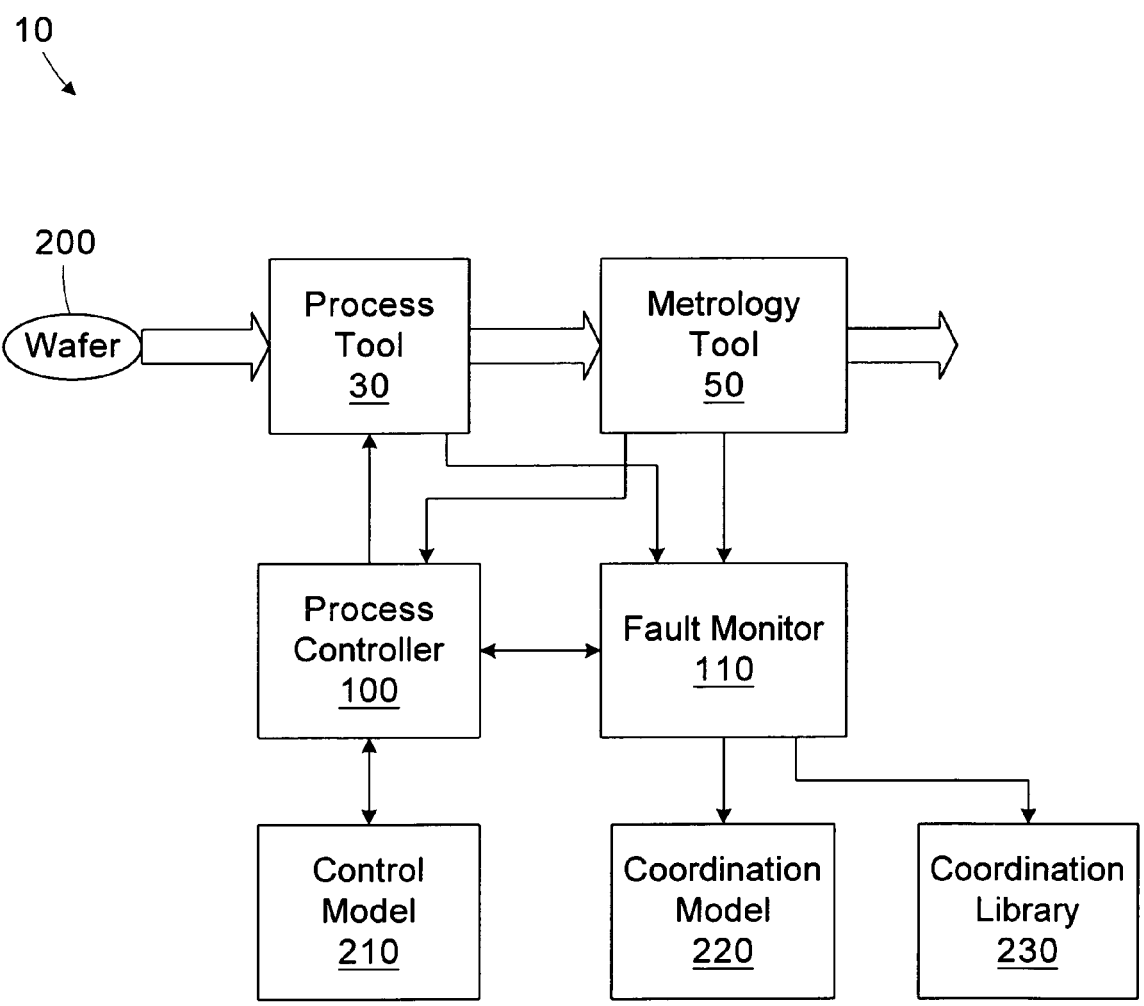
FIG. 2 is a simplified block diagram of a portion of the manufacturing system of FIG. 1.

Turning now to FIG. 2, a simplified block diagram of a portion of the manufacturing system 10 of FIG. 1 is provided. The process tool 30 processes wafers 200 according to an operating recipe. The process tool 30 may also be a single chamber of a multiple chamber tool 30. The metrology tool 50 measures output characteristics of the wafers processed in the process tool 30 to gauge the efficacy of the process implemented by the process tool 30. The metrology data collected by the metrology tool 50 is passed to the process controller 100 for dynamically updating the operating recipe of the process tool 30 to reduce variation between the measured output characteristic and a target value for the characteristic.

The process controller 100 communicates with the fault monitor 110 to coordinate its control actions with changes to the fault detection thresholds used by the fault monitor 110. The process controller 100 employs a control model 210 for generating control actions for updating a process variable in the operating recipe. The particular process variable controlled by the process controller 100 may vary depending on the particular process tool 30 being controlled and the type of process being performed. For example, in a plasma enhanced chemical vapor deposition (PECVD) tool, the operating recipe may include settings for five different gas flows, three different pressure values, and six different RF power values. Changes in these variable may occur in single or multiple recipe steps. The process controller 100 may be configured to control two of the gas flows (e.g., reactant gases) based on measured feedback (e.g., composition or thickness of deposited layer) from the metrology tool 50.

During the deposition process, the process tool 30, or various sensors associated with the process tool 30, measure process variables, such as the gas flows, pressure values, and gas flow rates. These measured values may be analyzed by the fault monitor 110 during or after completion of the processing run using a tool health model. If the observed values do not match the expected values, the fault monitor 110 indicates a tool health problem and can shut down the process tool 30 so that corrective actions may be taken prior to processing additional wafers 200.

Because the process controller 100 is intentionally changing its controlled variable(s), such as the gas flow rates, changes in the observed values of these parameters would be expected following implementation of a control action. The change in gas flow rates might have a slight affect on one or more of these pressures, but it may not affect them all. Without intervention from the process controller 100 to notify the fault monitor 110 of the control actions, the tool health model implemented by the fault monitor 110 might interpret these changes as indicating that the process tool 30 is not reacting in an expected manner. Accordingly, the tool health would drop and the process tool 30 might be shut-down unnecessarily.

To avoid problems, such as unnecessary tool shutdowns, caused by a lack of coordination between the control actions and the fault detection thresholds, the process controller 100 notifies the fault monitor 110 of a pending and/or implemented control action. The fault monitor 110 then updates its fault detection thresholds based on the control action. Although the fault monitor 110 is described as updating its own thresholds, it is also contemplated that the process controller 100 may be configured to calculate the thresholds based on the control actions itself and communicate the new thresholds to the fault monitor 110.

There are various techniques the fault monitor 110 may use to update its fault detection thresholds. In one embodiment, the fault monitor 110 may access a coordination model 220 using the control action provided by the process controller 100 to calculate new fault detection thresholds. For example, if the flow rate changes by X liters per minute, the expected change in the pressure value could be calculated. Various modeling techniques, well known to those of ordinary skill in the art, are suitable for implementing the coordination model 220. The coordination model 220 may be developed empirically using commonly known linear or non-linear techniques. The coordination model 220 may also be calculated theoretically using first principles equations. The coordination model 220 may be a relatively simple equation based model (e.g., linear, exponential, weighted average, etc.) or a more complex model, such as a neural network model, principal component analysis (PCA) model, or a projection to latent structures (PLS) model. The specific implementation of the coordination model 220 may vary depending on the modeling technique selected.

In another embodiment, the process controller 100 may access a coordination library 230. Data, such as tool state data and operating recipe data, collected from previous processing runs of the process tool 30 may be stored in the library along with associated fault detection thresholds. The fault monitor 110 compares the operating recipe of the current run generated from the control action to the entries in the coordination library 230 and identifies the previous run closest to the settings and state for the current run. Techniques for matching the current run to the historical runs in the coordination library 230 are well known to those of ordinary skill in the art, so they are not described in greater detail herein. For example, a minimum least squares or nearest neighbor approach may be used.

After updating its fault detection thresholds based on the control action received from the process controller 100, the fault monitor 110 is properly configured for analyzing the results (e.g., tool health or metrology data) collected for the wafer processed using the operating recipe affected by the control action.

Figure 3:
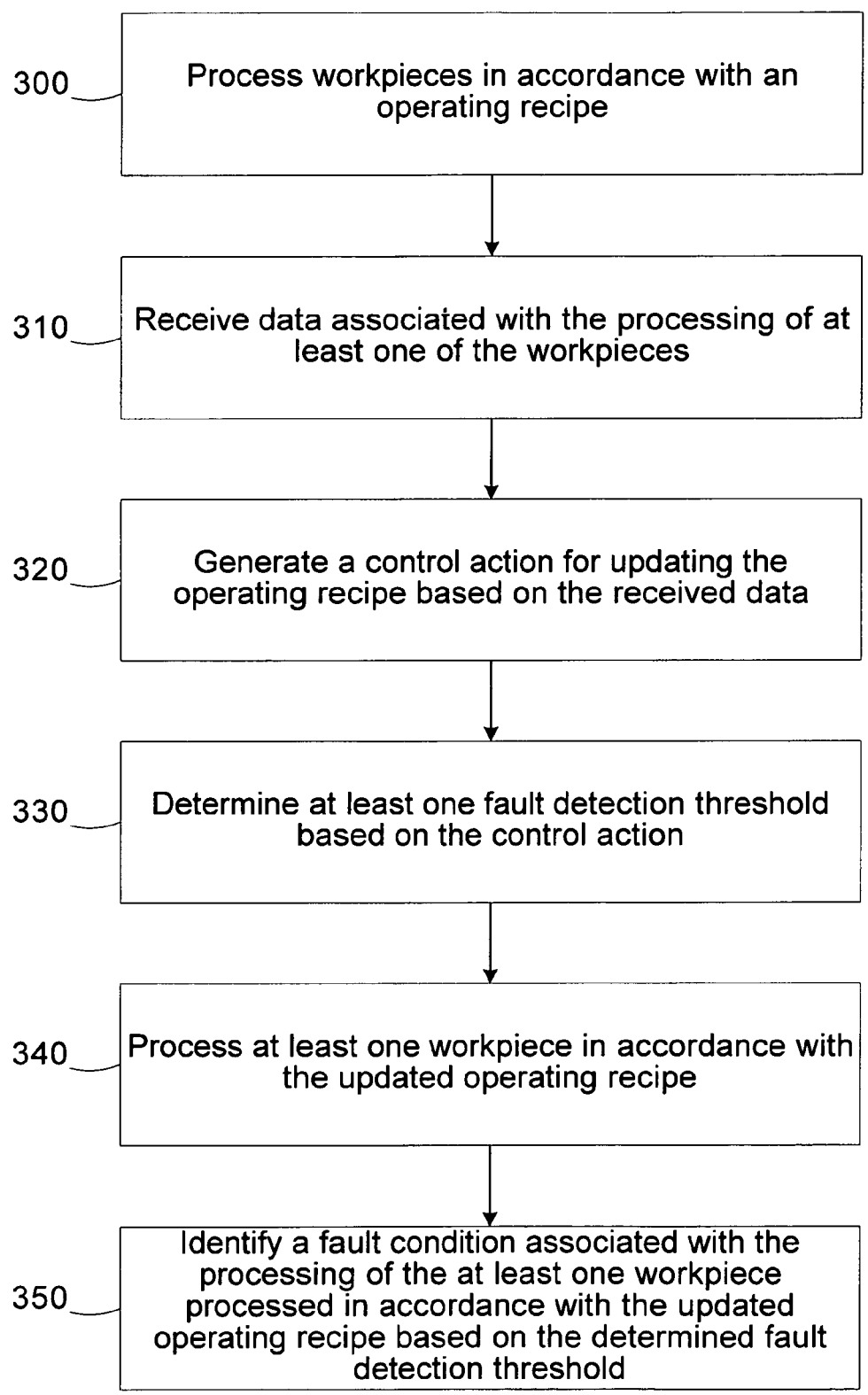
FIG. 3 is a simplified flow diagram of method for coordinating fault detection settings and process control changes in accordance with another illustrative embodiment of the present invention.

Turning now to FIG. 3, a simplified flow diagram of a method for coordinating fault detection settings and process control changes in accordance with another illustrative embodiment of the present invention is provided. In block 300, workpieces are processed in accordance with an operating recipe. In block 310, data associated with the processing of at least one of the workpieces is received. In block 320, a control action for updating the operating recipe based on the received data is generated. In block 330, at least one fault detection threshold is determined based on the control action. In block 340, at least one workpiece is processed in accordance with the updated operating recipe. In block 350, a fault condition associated with the processing of the at least one workpiece processed in accordance with the updated operating recipe is identified based on the determined fault detection threshold.

By updating its fault detection thresholds based on the control actions received from the process controller 100, the fault monitor 110 more effectively identifies faults in the manufacturing system 10. The likelihood of an unnecessary too shutdown is reduced. This gain improvise the efficiency, and ultimately, the profitability of the manufacturing system 10.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   receiving data associated with the processing of at least one workpiece in a process tool;
   determining a control action in a process controller associated with the process tool for automatically updating an operating recipe of the process tool based on the received data;
   determining at least one fault detection threshold based on the control action; and
   identifying a fault condition associated with the processing of a workpiece by the process tool based on the determined fault detection threshold.

2. The method of claim 1, wherein identifying the fault condition further comprises calculating a tool health metric associated with the process tool based on the determined fault detection threshold.

3. The method of claim 2, wherein identifying the fault condition further comprises:
   measuring a characteristic of the workpiece processed by the process tool using the updated operating recipe; and
   comparing the measured characteristic to the determined fault detection threshold.

4. The method of claim 1, wherein determining the at least one fault detection threshold further comprises applying a coordination model to the control action.

5. The method of claim 1, wherein determining the at least one fault detection threshold further comprises:
   comparing the control action to a coordination library of historical processing runs, each entry in the coordination library having an associated fault detection threshold;
   identifying the historical processing run closest to a current processing run associated with the control action; and
   selecting the fault detection threshold associated with the identified historical processing run.

6. A method, comprising:
   processing workpieces in accordance with an operating recipe;
   receiving data associated with the processing of at least one of the workpieces;
   generating a control action for automatically updating the operating recipe based on the received data;
   determining at least one fault detection threshold based on the control action;
   processing at least one workpiece in accordance with the updated operating recipe; and
   identifying a fault condition associated with the processing of the at least one workpiece processed in accordance with the updated operating recipe based on the determined fault detection threshold.

7. A system, comprising:
   a process tool for processing a workpiece;
   a process controller configured to determine a control action for automatically updating an operating recipe of the process tool; and
   a fault monitor configured to determine at least one fault detection threshold based on the control action and identify a fault condition associated with the processing of the workpiece by the process tool based on the determined fault detection threshold.

8. The system of claim 7, wherein the fault monitor is further configured to calculate a tool health metric associated with the process tool based on the determined fault detection threshold.

9. The system of claim 7, further comprising a metrology tool configured to measure a characteristic of the workpiece processed by the process tool, wherein the fault monitor is further configured to compare the measured characteristic to the determined fault detection threshold to identify the fault condition.

10. The system of claim 7, wherein the fault monitor is further configured to apply a coordination model to the control action to determine the at least one fault detection threshold.

11. The system of claim 7, wherein the fault monitor is further configured to compare the control action to a coordination library of historical processing runs, each entry in the coordination library having an associated fault detection threshold, identify the historical processing run closest to a current processing run associated with the control action, and selecting the fault detection threshold associated with the identified historical processing run to determine the at least one fault detection threshold.

12. A system, comprising:
- a process tool configured to process workpieces in accordance with an operating recipe;
- a process controller configured to receive data associated with the processing of at least one of the workpieces and generate a control action for automatically updating the operating recipe based on the received data; and
- a fault monitor configured to determine at least one fault detection threshold based on the control action, wherein the process tool is further configured to process at least one workpiece in accordance with the updated operating recipe, and the fault monitor is further configured to identify a fault condition associated with the processing of the at least one workpiece processed in accordance with the updated operating recipe based on the determined fault detection threshold.

13. A system, comprising:
- means for receiving data associated with the processing of at least one workpiece in a process tool;
- means for determining a control action for automatically updating an operating recipe of the process tool based on the received data;
- means for determining at least one fault detection threshold based on the control action; and
- means for identifying a fault condition associated with the processing of a workpiece by the process tool based on the determined fault detection threshold.

* * * * *